(12) United States Patent
Katou et al.

(10) Patent No.: US 10,340,346 B2
(45) Date of Patent: Jul. 2, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Hiroaki Katou, Nonoichi Ishikawa (JP); Kenya Kobayashi, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/918,387

(22) Filed: Mar. 12, 2018

(65) Prior Publication Data

US 2019/0088750 A1   Mar. 21, 2019

(30) Foreign Application Priority Data

Sep. 19, 2017 (JP) ................ 2017-179484

(51) Int. Cl.
| | |
|---|---|
| *H01L 29/40* | (2006.01) |
| *H01L 29/78* | (2006.01) |
| *H01L 29/06* | (2006.01) |
| *H01L 29/66* | (2006.01) |
| *H01L 29/10* | (2006.01) |

(52) U.S. Cl.
CPC ........ *H01L 29/407* (2013.01); *H01L 29/0696* (2013.01); *H01L 29/1095* (2013.01); *H01L 29/401* (2013.01); *H01L 29/404* (2013.01); *H01L 29/66734* (2013.01); *H01L 29/7813* (2013.01)

(58) Field of Classification Search
CPC ... H01L 29/402; H01L 29/401; H01L 29/407; H01L 29/1095; H01L 29/0696; H01L 29/7813; H01L 29/66734; H01L 29/8128; H01L 21/82345
See application file for complete search history.

(56) References Cited

U.S. PATENT DOCUMENTS

| | | |
|---|---|---|
| 8,866,220 B2 | 10/2014 | Kobayashi |
| 9,041,098 B2 | 5/2015 | Ichinoseki |

(Continued)

FOREIGN PATENT DOCUMENTS

| | | |
|---|---|---|
| JP | 2014-027182 A | 2/2014 |
| JP | 2014-120656 A | 6/2014 |
| JP | 2015-023166 A | 2/2015 |

*Primary Examiner* — Yosef Gebreyesus
(74) *Attorney, Agent, or Firm* — White & Case LLP

(57) ABSTRACT

A semiconductor device includes a drain layer, a drift layer, a base region, a source region, trenches, base contact region, gate regions, and field plate electrodes. The drain layer extends in a first and a second direction. The drift layer is on the drain layer. The base region is on the drift layer. The source region is on the base region. The trenches are in an array and each trench reaches the drift layer from the source region. The base contact region is along the second direction in a region in which the trenches do not contiguously exist along the second direction and electrically connects the source region to the base region. Each gate regions is along an inner wall of the trenches. Each field plate electrodes is in an inside of the gate regions and is longer than the gate regions in the third direction.

10 Claims, 18 Drawing Sheets

(56) References Cited

U.S. PATENT DOCUMENTS

| | | | | |
|---|---|---|---|---|
| 9,530,882 B1* | 12/2016 | Hsieh | ............... | H01L 29/7813 |
| 2002/0030237 A1* | 3/2002 | Omura | ............... | H01L 29/8725 |
| | | | | 257/397 |
| 2007/0181975 A1* | 8/2007 | Koops | ............... | H01L 29/407 |
| | | | | 257/559 |
| 2013/0062688 A1* | 3/2013 | Kobayashi | ............ | H01L 29/407 |
| | | | | 257/330 |
| 2013/0069150 A1* | 3/2013 | Matsuoka | ............ | H01L 29/407 |
| | | | | 257/330 |
| 2017/0170274 A1* | 6/2017 | Wutte | ............... | H01L 29/0696 |

* cited by examiner

ND DEVICE

CROSS REFERENCE TO RELATED APPLICATIONS

This application is based upon and claims the benefit of priority from the prior Japanese Patent Application No. 2017-179484, filed on Sep. 19, 2017, the entire contents of which are incorporated herein by reference.

FIELD

The embodiments of the present invention relate to a semiconductor device.

BACKGROUND

To secure a breakdown voltage of a low breakdown voltage metal-oxide-semiconductor field-effect-transistor (MOSFET) with a field plate structure, it is necessary to deepen a trench and increase a thickness of a field plate insulating film, and it is necessary to increase a volume of the trench. For this reason, a current path of a drift layer is narrowed due to the trench, and movement of carriers is prevented, so that a trade-off occurs in which on-resistance increases. To avoid this problem, it is an important task to reduce the on-resistance of the drift layer by making the trench as narrow as possible. For example, research has been conducted to reduce a width of a source electrode to secure a width of the drift layer.

DETAILED DESCRIPTION

Figure 1:
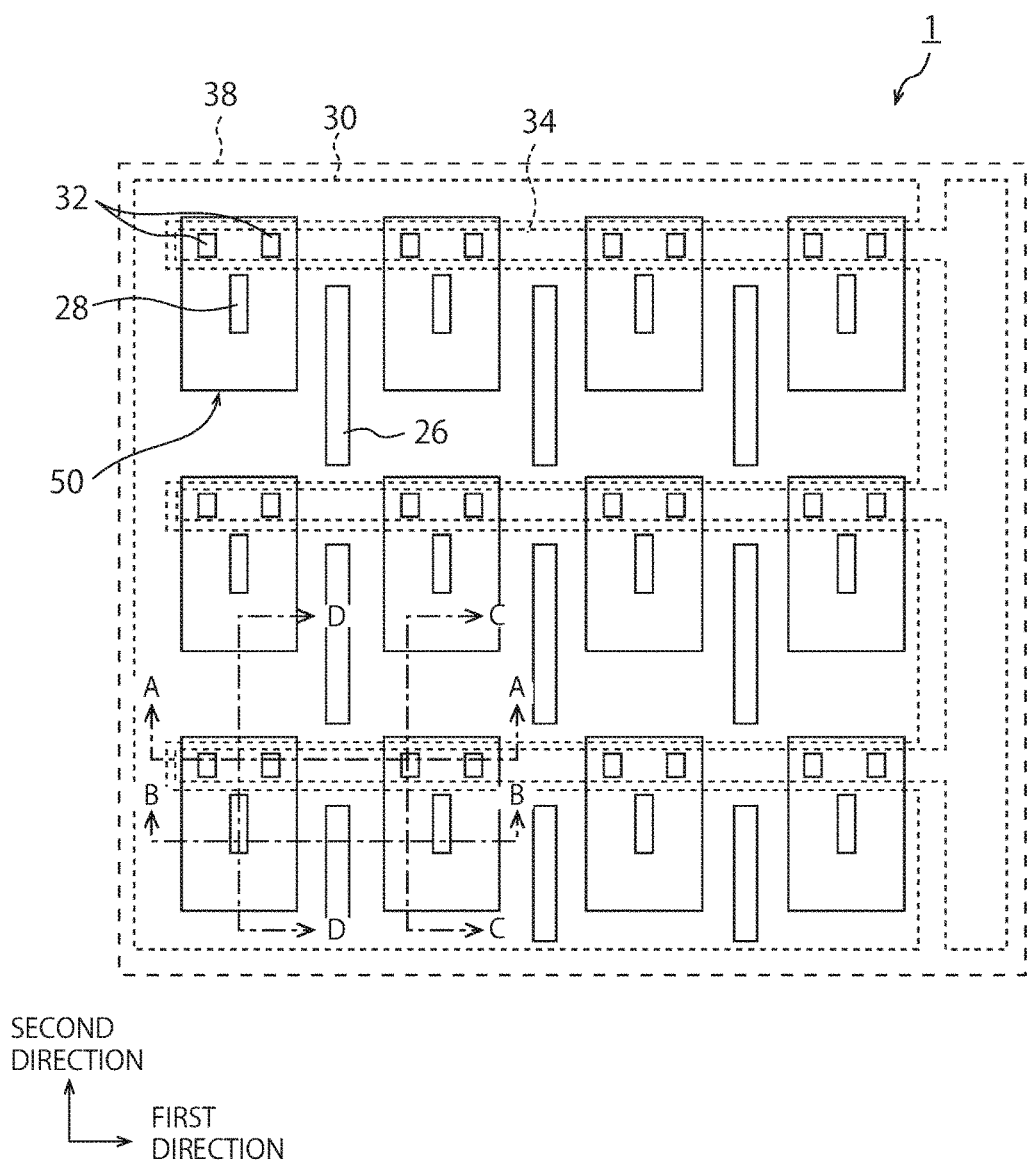
FIG. 1 is a plan view schematically illustrating a semiconductor device according to an embodiment.

According to one embodiment, a semiconductor device includes a drain layer, a drift layer, a base region, a source region, trenches, base contact region, gate regions, field plate electrodes, first source contacts, second source contacts, and gate contacts. The drain layer of a first conductivity type extends in a first direction and a second direction crossing the first direction. The drift layer of the first conductivity type is formed on a surface that is one surface in a third direction crossing the first direction and the second direction of the drain layer. The base region of a second conductivity type is formed on a surface of the drift layer. The source region of the first conductivity type is formed on a surface of the base region. The plurality of trenches are formed in an array in the first direction and the second direction and the each of the trenches reaches the drift layer through the base region along the third direction from a surface of the source region. The base contact region of the second conductivity type is formed along the second direction in a region in which the trenches do not contiguously exist along the second direction between the trenches along the first direction and the base contact region is formed in the source region to electrically connect the source region to the base region being separate from the trenches. Each of the plurality of gate regions is formed along an inner wall of corresponding one of the trenches, via an insulating film, inside the corresponding one of the trenches. Each of the plurality of field plate electrodes is formed in an inside of corresponding one of the gate regions, via the insulating film, inside the corresponding one of the trenches along the third direction, and is formed longer than the corresponding one of the gate regions in the third direction Each of the plurality of first source contacts is formed on the base contact region and the source region along the second direction between the trenches along the first direction and the first source contacts electrically connect the base contact region to the source region. The plurality of second source contacts on each of the field plate electrode are connected the corresponding field plate electrode. The plurality of gate contacts on the corresponding gate region are electrically connected the gate region.

Embodiments will now be explained with reference to the accompanying drawings. The present invention is not limited to the embodiments. In the drawings, a ratio, a scale and the like are not accurate, and a portion indicated by a straight line or a flat surface is not necessarily a straight line or a flat surface, and may have unevenness at a degree not departing from a function and effect of a present embodiment. For simplicity of explanation, it is assumed that a drain layer is in a lower side, and a metal layer and a semiconductor layer such as a drift layer are formed above the drain layer.

(Structure)

Positions in a plan view of a gate region, a source region and the like will be described. FIG. 1 is a plan view schematically illustrating a semiconductor device 1 according to the present embodiment. The semiconductor device 1 is, for example, an n-type power MOSFET. A drain layer and a drift layer of the semiconductor device 1 are not illustrated, and each metal layer that applies a voltage to the gate region, the source region, and a field plate region is indicated by a broken line or a solid line.

A first direction and a second direction are defined as illustrated in FIG. 1. The first direction and the second direction are illustrated to be orthogonal to each other; however, not limited thereto, the first direction and the second direction may cross at an angle other than a right angle.

The semiconductor device 1 includes a plurality of trenches 50 in the semiconductor layer including a base region, the source region, and a base contact region on the upper surface of the drift layer. The trenches 50 are provided, for example, in a rectangular lattice along the first direction and the second direction. For convenience of explanation, the trenches 50 each configures a rectangular region that has sides parallel to the first direction and the second direction and in which the sides parallel to the second direction are longer than the sides parallel to the first direction. The configuration of each of the trenches 50 is not limited thereto, and may be, for example, a square shape. In this case, an arrangement of the trenches 50 in the semiconductor layer may also be a square lattice.

Between the two trenches 50 formed along the first direction, the base contact region for applying a voltage to the base region is formed in the source region so as not to be adjacent to the trenches 50. A first source contact 26 for applying a voltage to the base contact region and the source region is placed along the second direction between the trenches 50 formed along the first direction. The first source contact 26 is further connected, on the upper surface thereof, to a first metal layer 30.

In this way, each of the trenches 50 is separated from the other trenches 50 in the first direction and the second direction, and each of the trenches 50 is independently formed.

In each of the trenches 50, a field plate electrode along the second direction is provided. A second source contact 28 connects the field plate electrode and the first metal layer 30. That is, the second source contact 28 is connected, on the lower surface thereof, to the field plate electrode, and is connected, on the upper surface, to the first metal layer 30.

Around the field plate electrode, the gate region is formed to go around the inner wall of each of the trenches 50. Two gate contacts 32 for applying a voltage to the gate region are formed in each of the trenches 50 along the first direction. Each of the gate contacts 32 is connected, on the lower surface thereof, to the gate region, and connected, on the upper surface, to a second metal layer 34.

In the above description, it is described that each contact and metal are separate; however, they may be integrally formed. That is, the first source contact 26 and the second source contact 28 may be formed integrally with the first metal layer 30, or the gate contact 32 may be formed integrally with the second metal layer 34.

The above is a description of an arrangement of the trenches 50 in a plan view of the semiconductor device 1. Subsequently, a structure of the semiconductor device 1 will be described with reference to cross-sectional views.

Figure 2A:
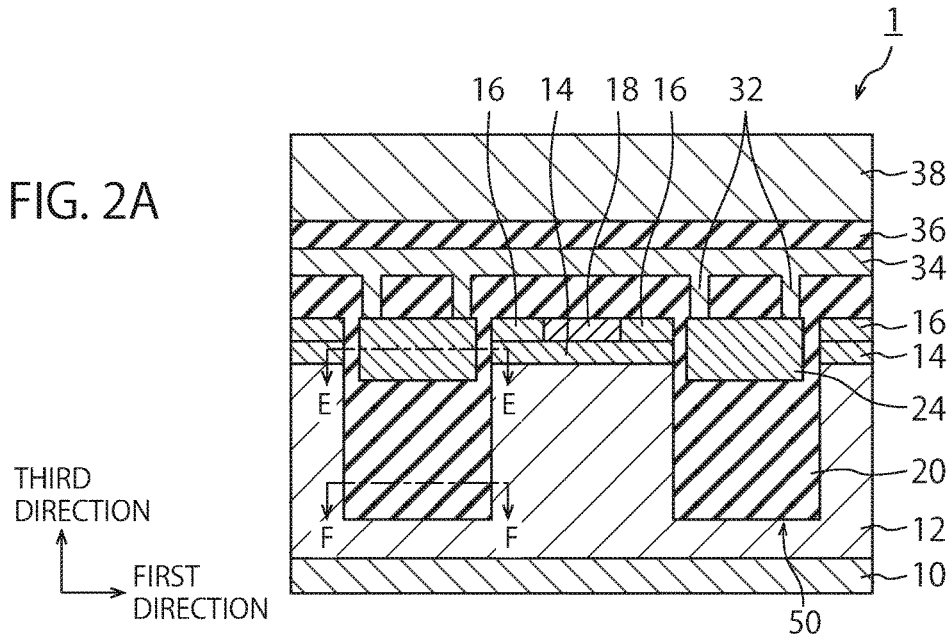
FIGS. 2A to 3B are cross-sectional views of the semiconductor device according to the embodiment.
Figure 2B:
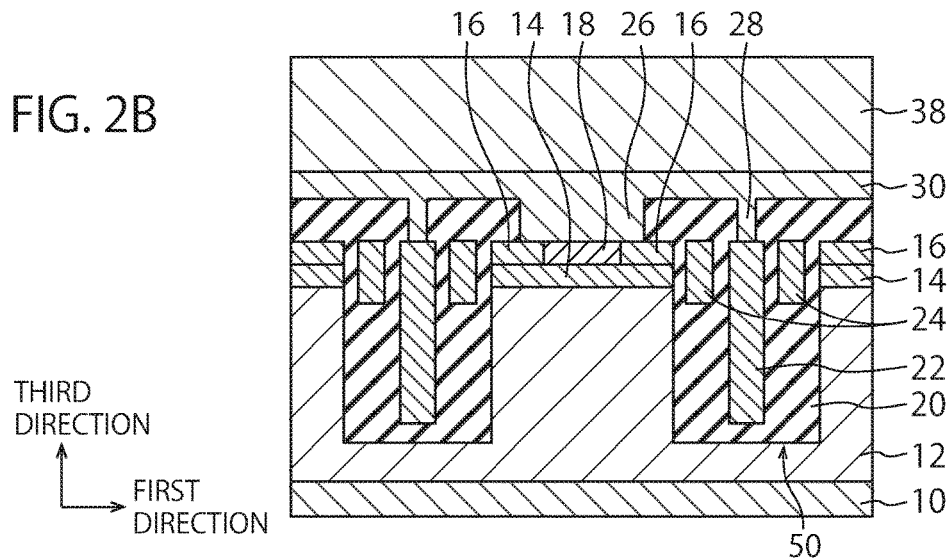

FIG. 2A is an A-A cross-sectional view in FIG. 1, and FIG. 2B is a B-B cross-sectional view in FIG. 1. Each figure illustrates a connection between the gate region and the metal, and a connection between the source region and the metal. The structure along the first direction will be described with reference to these two figures. A third direction is a direction substantially orthogonal to the first direction and the second direction; however, not limited thereto, the third direction may have an angle other than a right angle. Hereinafter, as for a vertical direction and a height direction, with reference to the third direction, a direction in which a drain layer 10 is provided is referred to as a lower side, and a direction in which the metal layer is provided is referred to as an upper side.

The semiconductor device 1 includes the drain layer 10, a drift layer 12, a base region 14, a source region 16, a base contact region 18, an insulating film 20, a field plate electrode 22, a gate region 24, the first source contact 26, the second source contact 28, the first metal layer 30, the gate contact 32, the second metal layer 34, an interlayer insulating film 36, and a third metal layer 38. Among these, the field plate electrode 22 and the gate region 24 are provided in each of the trenches 50 via the insulating film 20.

The drain layer 10 is a layer that forms the drain of the semiconductor device 1. The drain layer 10 is formed of a semiconductor of a first conductivity type, for example, an $n^+$-type semiconductor. The drain layer 10 is connected, on the lower surface thereof, to a drain electrode (not illustrated), and a carrier flow is formed from the source to the drain by applying a potential difference between the source and the drain.

The drift layer 12 is a layer for adjusting a voltage applied to the semiconductor device 1. The drift layer 12 is formed of the semiconductor of the first conductivity type, for example, an $n^-$-type semiconductor. The drift layer 12 is formed such that the lower surface thereof is in contact with the upper surface of the drain layer 10.

The base region 14 is arranged such that the lower surface thereof is in contact with the upper surface of the drift layer 12. The base region 14 is formed of a semiconductor of a second conductivity type, for example, a $p^-$-type semiconductor. The base region 14 is a region that forms a channel and enables carriers to flow from the source region 16 to the drain layer 10 in a case where a voltage is applied to the gate region 24.

The source region 16 is arranged such that the lower surface is in contact with the upper surface of the base region 14. The source region 16 is formed of the semiconductor of the first conductivity type, for example, the $n^+$-type semiconductor. The carriers flow from the source region 16 to the drain layer 10 by a potential difference between the source region 16 and the drain layer 10 in a case where a voltage is properly applied to the gate region 24.

The base contact region 18 is arranged adjacent to the source region 16 for applying a voltage to the base region 14, and such that the lower surface thereof is in contact with the base region 14. The base contact region 18 is formed of the semiconductor of the second conductivity type, for example, a $p^+$-type semiconductor.

The insulating film 20 includes a field plate insulating film that insulates the field plate electrode 22 from other regions, an interlayer insulating film that insulates the gate region 24 from other regions, and an interlayer insulating film that insulates the source region 16 from other regions, and is appropriately insulates these electrodes or regions from other regions. The insulating film 20 is provided in the trenches 50 and between the semiconductor layer and the metal layer.

The field plate electrode 22 is arranged in each of the trenches 50 via the insulating film 20 along a direction of each of the trenches 50 in a direction from the drain layer 10 to the source region 16, that is, in the vertical direction. The field plate electrode 22 is formed, for example, with polysilicon. The field plate electrode 22 may be connected to an electrode for applying a voltage to the source region.

The gate region 24 is a region for forming a channel or a depletion layer in the base region 14 in accordance with an applied voltage. The gate region 24 is arranged via the insulating film 20 to go around the field plate electrode 22 along the inner wall of each of the trenches 50. The gate region 24 is formed, for example, with polysilicon.

The first source contact 26 is arranged such that the lower surface thereof is in contact with the upper surfaces of the source region 16 and the upper surface of the base contact region 18, and to cover the base contact region 18. The first source contact 26 is formed, for example, with the same metal as the first metal layer 30.

The second source contact 28 is arranged such that the lower surface thereof is in contact with the upper surface of the field plate electrode 22. Similarly to the first source contact 26, the second source contact 28 is also formed, for example, with the same metal as the first metal layer 30.

The first metal layer 30 is a layer including a metal functioning as an electrode for applying a voltage to the source. The first metal layer 30 is arranged on the upper surface of the gate region 24 via the insulating film 20, is arranged on the upper surfaces of the source region 16 and the base contact region 18 via the first source contact 26, and is arranged on the upper surface of the field plate electrode 22 via the second source contact 28. As described above, the first metal layer 30 may be integrally formed with the first source contact 26 and the second source contact 28. As illustrated in the figure, the first metal layer 30 may be partially provided with the source region 16, the base contact region 18, and the field plate electrode 22 via the insulating film 20.

The gate contact 32 is arranged such that the lower surface thereof is in contact with the upper surface of the gate region 24. The gate contact 32 is formed, for example, with the same metal as the second metal layer 34.

The second metal layer 34 is a layer including a metal functioning as an electrode for applying a voltage to the gate. The second metal layer 34 is arranged on the upper surface of the gate region 24 via the gate contact 32, and is arranged on the upper surfaces of the source region 16 and the base contact region 18 via the insulating film 20. As described above, the second metal layer 34 may be integrally formed with the gate contact 32. As illustrated in the figure, the second metal layer 34 may be partially arranged on the gate region 24 via the insulating film 20. As illustrated in FIG. 1, the second metal layer 34 may be formed not to cover the upper surface of the field plate electrode 22.

As illustrated in FIGS. 2A and 2B, the first metal layer 30 and the second metal layer 34 may be formed to be insulated from each other in the same layer such that distances from the drain layer 10 are equal to each other.

The interlayer insulating film 36 is an insulating film selectively arranged on the upper surface of the second metal layer 34 and the upper surface of the insulating film 20 around the second metal layer 34 in a metal layer formed of the first metal layer 30 and the second metal layer 34. The interlayer insulating film 36 has a function of insulating the second metal layer 34 from the third metal layer 38.

The third metal layer 38 is arranged in the metal layer formed of the first metal layer 30 and the second metal layer 34. The third metal layer 38 is in contact with the upper surface of the first metal layer 30, and is arranged on the upper surface of the second metal layer 34 via the interlayer insulating film 36. As can be seen from this structure, the third metal layer 38 is selectively connected to the first metal layer 30. That is, the third metal layer 38 has a function as an electrode for applying a voltage to the first metal layer 30, and consequently the source region and the like.

As described above, in the semiconductor device 1, the drift layer 12 is formed on the upper surface of the drain layer 10, and the base region 14 is formed on the upper surface of the drift layer 12. On the upper surface of the base region 14, the source region 16 is formed, and the base contact region 18 is selectively formed. In the semiconductor layer formed of these, the plurality of trenches 50 is formed along the third direction to reach the drift layer 12 through the base region 14 from the upper surface of the source region 16, in a lattice with respect to the first direction and the second direction.

In the inside of each of the trenches 50, along the inner wall thereof, the gate region 24 is formed via the insulating film 20, and in the inside of the gate region 24, the field plate electrode 22 is formed via the insulating film 20. As illustrated in FIG. 2B, the gate region 24 is formed shorter than the length in which the field plate electrode 22 is formed in the third direction. Further, the gate region 24 may be formed deeper in a direction to the drain layer 10 than the base region 14.

In FIGS. 2A to 14D, the source region 16 and the gate region 24 are formed such that the upper surfaces thereof have equivalent heights; however, the present invention is not limited thereto. For example, to avoid increasing capacitance between the source and the gate, the upper surface of the gate region 24 may be formed to be positioned at the height equivalent to the lower surface of the source region 16, or the position of the upper surface of the gate region 24 may be shifted further downward than the lower surface of the source region 16.

The insulating film 20 is formed on the upper surfaces of the source region 16, the base contact region 18, the field plate electrode 22, and the gate region 24, and contacts are selectively formed in the insulating film 20 for applying voltages to respective regions in which the regions and the electrode exist.

As illustrated in FIG. 1, the first metal layer 30 is formed to be in contact with the lower surface of the third metal layer 38 serving as a source electrode for applying a voltage to the source, and the upper surfaces of the contacts connected to the source region 16, the base contact region 18, and the field plate electrode 22. Meanwhile, the second metal layer 34 serving as a gate electrode for applying a voltage to the gate is formed under the third metal layer 38 to be in contact with the upper surface of the gate contact 32, and not to be electrically connected to the third metal layer 38 via the interlayer insulating film 36.

Figure 3A:
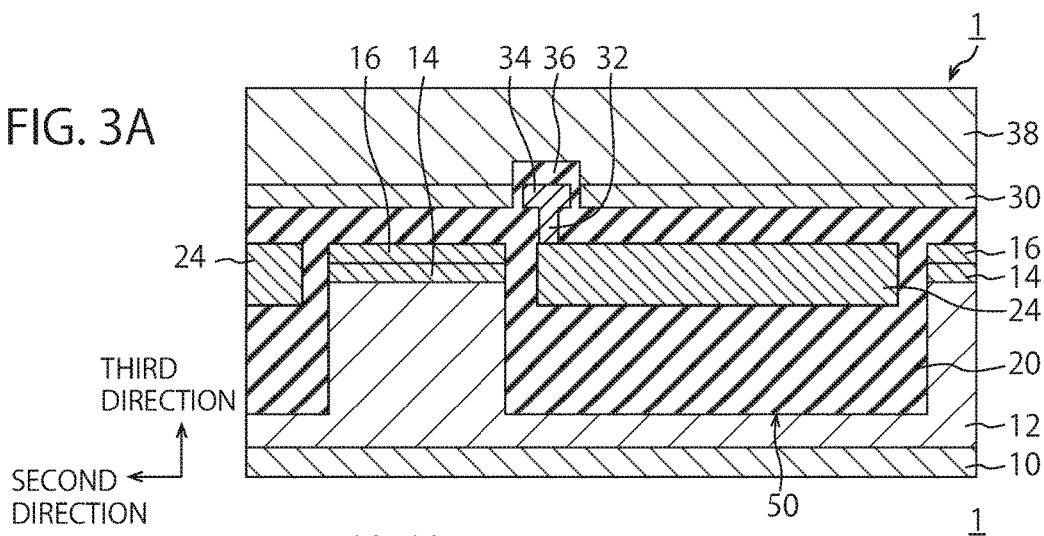
Figure 3B:
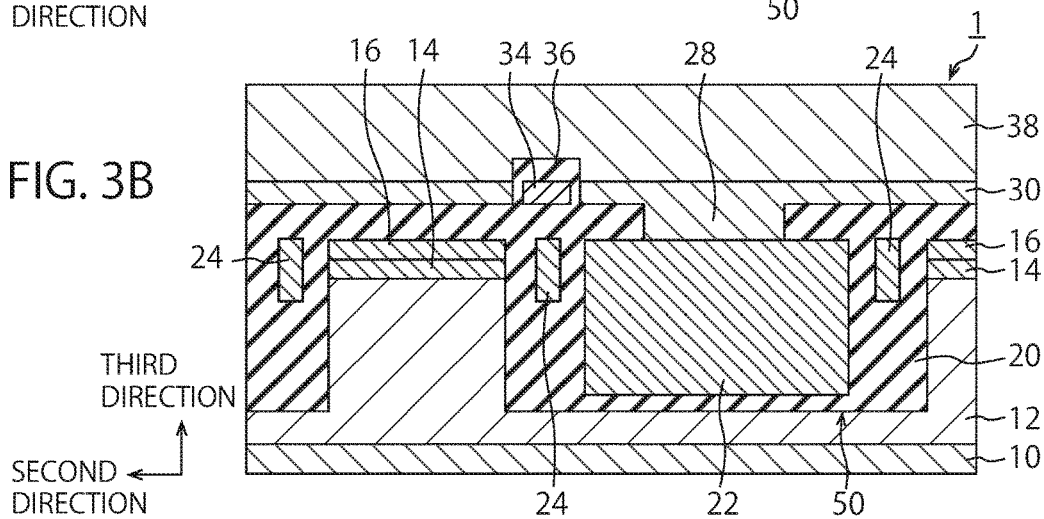

FIGS. 3A and 3B are views respectively illustrating a C-C cross-sectional view and a D-D cross-sectional view in FIG. 1. That is, FIG. 3A is a view illustrating a cross section including the gate contact 32, and FIG. 3B is a view illustrating a cross section including the second source contact 28.

As illustrated in FIGS. 2A and 3A, the gate region 24 is provided on the upper side of the inner wall of each of the trenches 50 via the insulating film 20 to go around the inside of each of the trenches 50. The second metal layer 34 is arranged along the first direction to be electrically connected to the gate contact 32 and, via the insulating film, to be insulated from the first metal layer 30 and the third metal layer 38.

As illustrated in FIGS. 2B and 3B, the field plate electrode 22 is arranged via the insulating film 20 to extend in the second direction, in the inside of the gate region 24. The insulating film 20 is arranged on the upper surface of the field plate electrode 22, and the second source contact 28 is selectively arranged in the insulating film 20. The first metal layer 30 is arranged to be contiguous in the first direction, and, in the second direction, to be insulated from the second metal layer 34 in a region where the second metal layer 34 exists, and the upper surface of the first metal layer 30 is connected to the third metal layer 38.

As illustrated in FIGS. 2A, 2B, 3A, and 3B, on the upper surface of the drift layer 12, the base region 14 is arranged in a region other than a region where each of the trenches 50 is provided, and on the upper surface of the base region 14, the source region 16 is provided. In the source regions 16 in the first direction between the regions in which two trenches 50 are arranged, the base contact region 18 is arranged to selectively extend in the second direction.

In a region between the trenches 50 existing along the second direction, similarly to a region between the trenches 50 existing along the first direction, the base region 14 and the source region 16 are formed. For example, compared to a case where each of the trenches 50 contiguously extends along the second direction, regions of the base region 14 and the source region 16 can be made wider by a region where each of the trenches 50 is not contiguous.

Figure 4A:
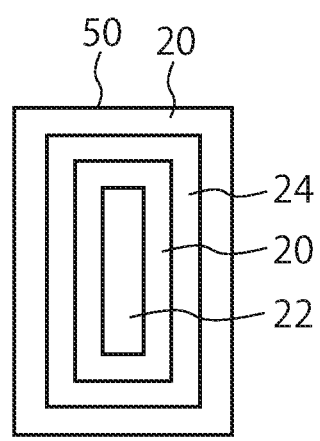
FIGS. 4A and 4B each are a plan cross-sectional view of a trench according to the embodiment.
Figure 4B:
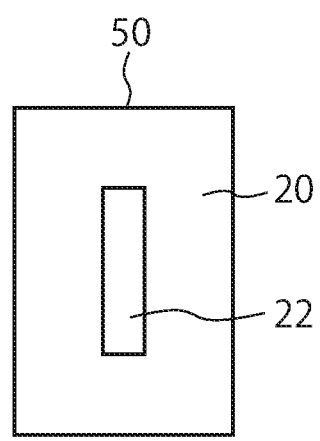

FIGS. 4A and 4B are cross-sectional views for explaining a structure inside each of the trenches 50 in more detail, and are views respectively illustrating an E-E cross section and an F-F cross section in FIG. 2A.

In the E-E cross section, as described above, the gate region 24 is formed via the insulating film 20 along the inner wall of each of the trenches 50, and the field plate electrode 22 is formed via the insulating film 20, in the inside of the gate region 24 that goes around. In the F-F cross section, the gate region 24 does not exist, so that the field plate electrode 22 is formed via the insulating film 20, inside each of the trenches 50.

As described above, according to the present embodiment, in the semiconductor device 1, while the field plate electrode 22 is included and the vertical trench structure is maintained in which depletion of the drift layer 12 is facilitated, the plurality of trenches 50 is arranged in a dot pattern (that is, in a lattice pattern), whereby each of the drift layer 12, the base region 14, and the source region 16 can be widened in a plan view. In particular, the drift layer 12 is integrally formed without being partitioned by each of the trenches. As a result, an effect can be obtained of reducing on-resistance by the field plate electrode 22, and the region of the drift layer can be increased, so that resistance in the drift layer 12 can be further reduced. This is because the base region 14 can be provided also in the region between the trenches 50 along the second direction, and a channel through which the carriers flow can be formed also in the region Considering about a layout, for example, assuming that each of the trenches 50 is a rectangular parallelepiped region, a pitch between the trenches 50 along the first direction is 3.0 µm, a distance between the trenches 50 is 1.2 µm, a pitch between the trenches 50 along the second direction is 4.0 µm, and a distance between the trenches 50 is 1.2 µm. An area in a plan view of the drift layer 12 is $(1.2 \times 4.0 + (3.0 - 1.2) \times 1.2)/(1.2 \times 4.0) = 1.45$ times, per unit cell of $3.0 \times 4.0$, in comparison with a case where each of the trenches 50 is contiguously exists along the second direction. The resistance in the drift layer 12 is 0.69 times that is the reciprocal of 1.45 times. Assuming that the resistance in the drift layer 12 is 68% of the on-resistance, resistance of the semiconductor device 1 as a whole is $0.68 \times (1 - 0.69) = 0.21$ times, and the on-resistance can be reduced by about 21%.

Further, as described above, a volume of the trench can be reduced, so that a warp of a wafer can be reduced.

In the above description, it is described that the first conductivity type is an n-type; however, the first conductivity type may be a p-type. In this case, the second conductivity type is the n-type. In a case of the n-type, examples of impurities include arsenic (As), phosphorus (P), and the like. In a case of the p-type, examples of impurities include boron (B), boron fluoride ($BF_2^+$), and the like.

In either case, main components of the drain layer 10, the drift layer 12, the base region 14, and the source region 16 are, for example, silicon (Si). Main components of the field plate electrode 22 and the gate region 24 are, for example, polysilicon containing impurities of the first conductivity type, amorphous silicon, and the like. A main component of the insulating film 20 is, for example, silicon oxide ($SiO_2$).

The structure as described above can be confirmed by examining the cross section by a method that can investigate the sample at a high magnification, such as SEM or TEM. As for the cross section, for example, a cross section obtained by cutting off the metal layer, that is, a cross section obtained by cutting off the metal layer and the insulating film 20 by a plane horizontal to the first direction and the second direction is confirmed, whereby the arrangement of the trenches 50 can be confirmed. In addition, a cross section cut by a plane horizontal to the first direction and the third direction, or the second direction and the third direction is confirmed, whereby the structure inside each of the trenches 50 can be confirmed.

(Production Method)

Hereinafter, a manufacturing process of the semiconductor device 1 according to the present embodiment will be described. Hereinafter, in FIGS. 5A to 14D, Fig. xA is a cross-sectional view illustrating an A-A cross section, Fig. xB is a cross-sectional view illustrating a B-B cross section, Fig. xC is a cross-sectional view illustrating a C-C cross section, and Fig. xD is a cross-sectional view illustrating a D-D cross section.

First, a semiconductor substrate is prepared in which the n-type drift layer 12 having an impurity concentration lower than that of the drain layer 10 is formed on the upper surface of the n⁺-type drain layer 10. Then, resist is formed on the upper surface of the drift layer 12, and etching is performed to selectively form the trenches 50. The trenches 50 are formed by dry etching, for example. Thereafter, the resist is removed, whereby the trenches 50 are formed in the drift layer 12, as illustrated in FIGS. 5A to 5D. A method for forming and removing the resist is not particularly limited.

Figure 5A:
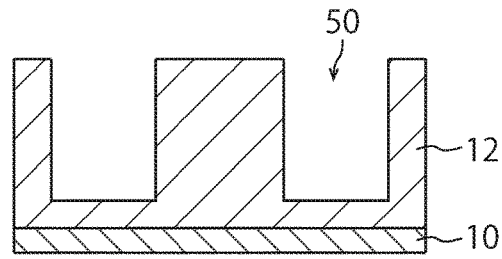
FIGS. 5A to 14D are views illustrating a manufacturing process of the semiconductor device according to the embodiment.
Figure 5B:
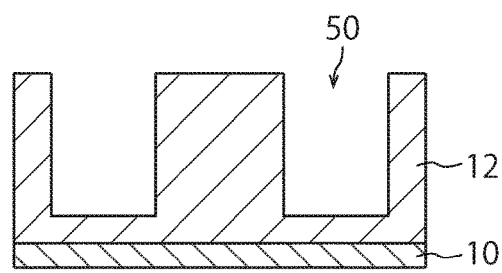
Figure 5C:
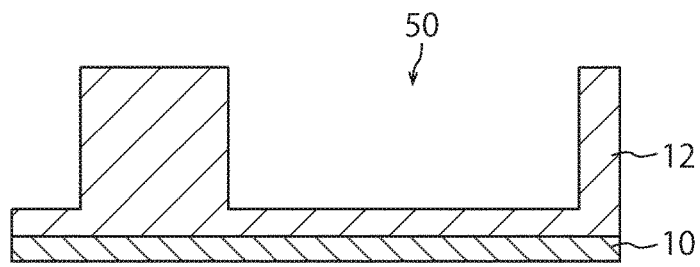
Figure 5D:
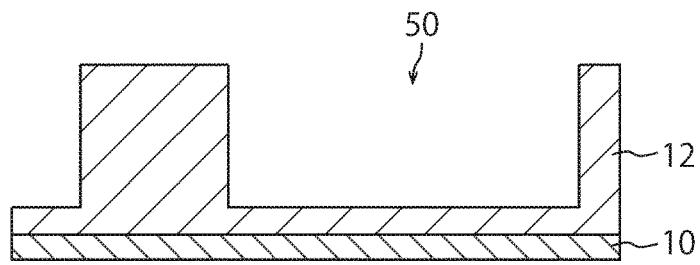
Figure 6A:
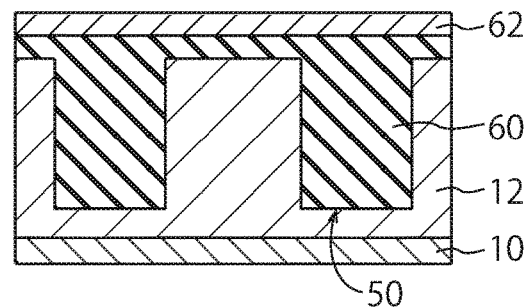
Figure 6B:
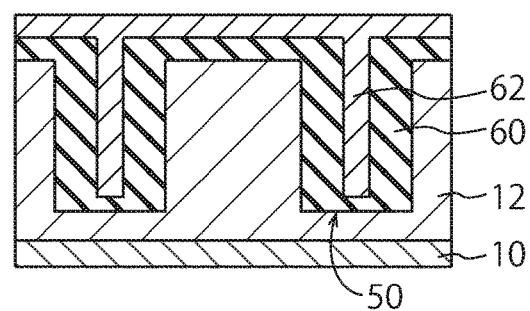
Figure 6C:
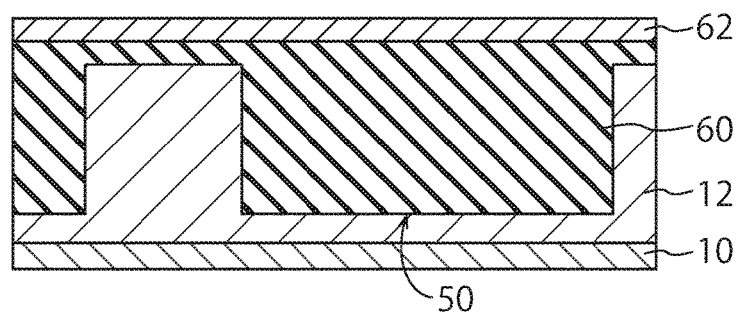
Figure 6D:
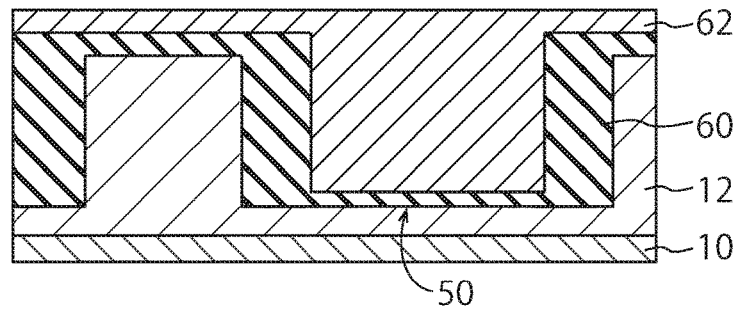
Figure 7A:
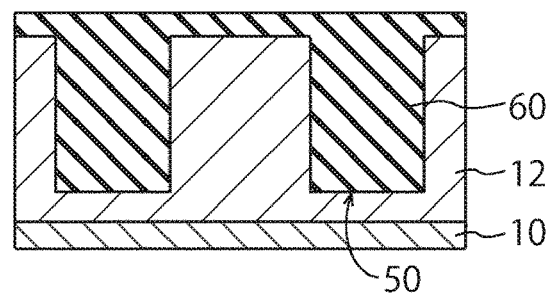
Figure 7B:
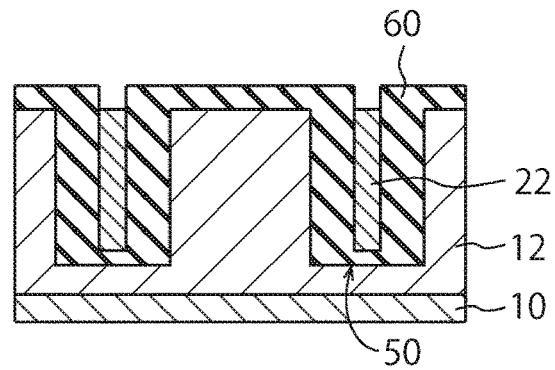
Figure 7C:
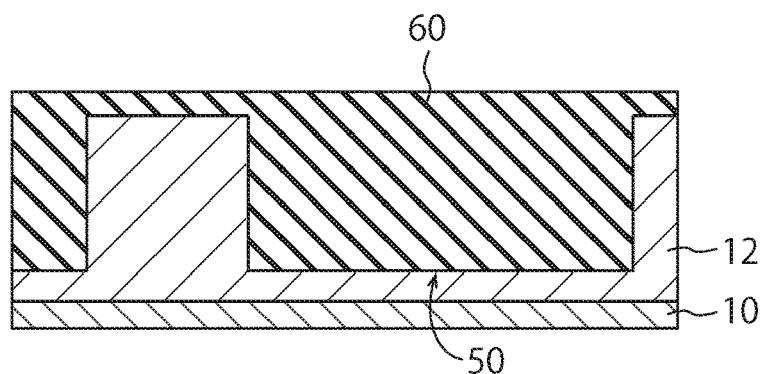
Figure 7D:
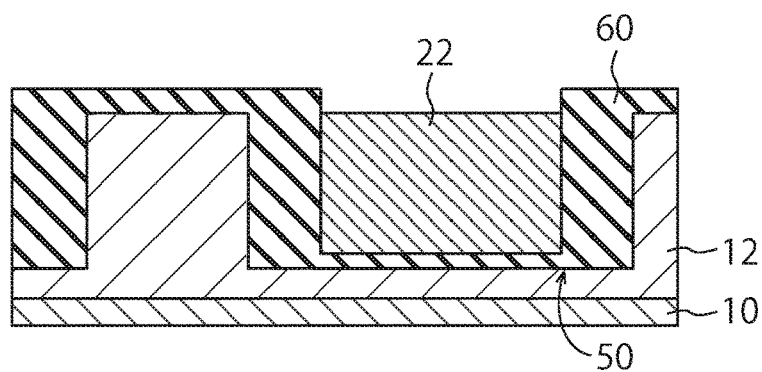

Comparing FIGS. 5A and 5B with FIGS. 5C and 5D, the width in the first direction of each of the trenches 50 and the width in the second direction have a large difference; however, the embodiments are not limited thereto, and the trenches 50 can be adopted each having an equivalent width. In the present embodiment, since the field plate electrode 22 is formed in each of the trenches 50, the width in the second direction is larger than the width in the first direction.

Next, as illustrated in FIGS. 6A to 6D, an insulating film 60 is formed on the inner wall of each of the trenches 50 and the upper surface of the drift layer 12. The insulating film 60 is formed by, for example, a thermal oxidation method or chemical vapor deposition (CVD). Then, on the upper surface of the insulating film 60 formed, a semiconductor film 62 is formed including polysilicon to be the field plate electrode 22 via the insulating film 60 in the trenches 50.

The semiconductor film 62 is formed by, for example, forming polysilicon on the inner wall and the upper surface of the insulating film 60 by CVD, and then diffusing impurities such as phosphorus (P) into the polysilicon formed. For example, by diffusing impurities into the polysilicon by thermal diffusion or ion implantation, the semiconductor film 62 is formed.

As illustrated in FIGS. 6A to 6D, through this process, the semiconductor film 62 is formed via the insulating film 60, selectively along the second direction, inside each of the trenches 50.

Next, as illustrated in FIGS. 7A to 7D, the semiconductor film 62 is etched, and etched back, whereby the field plate electrode 22 formed from the semiconductor film 62 is formed, via the insulating film 60, in each of the trenches 50. This etching is performed by, for example, reactive ion etching (RIE), chemical dry etching (CDE), or chemical mechanical polishing (CMP).

Figure 8A:
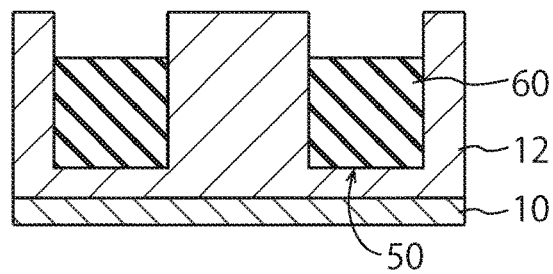
Figure 8B:
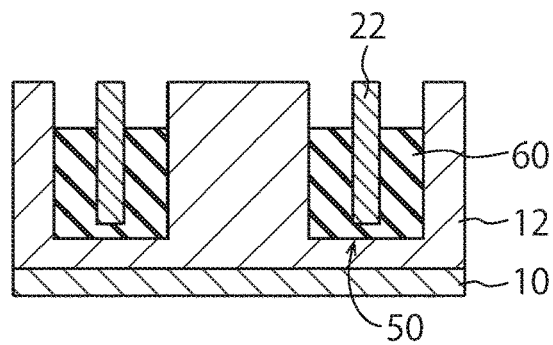
Figure 8C:
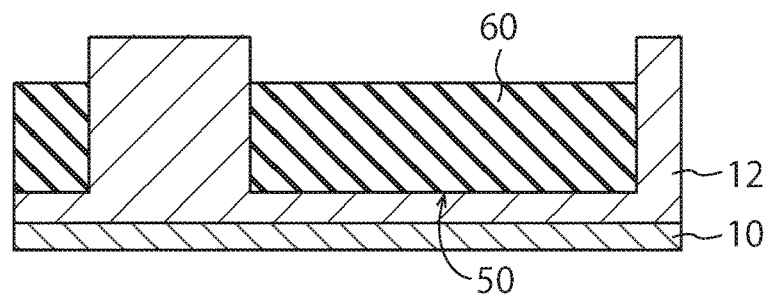
Figure 8D:
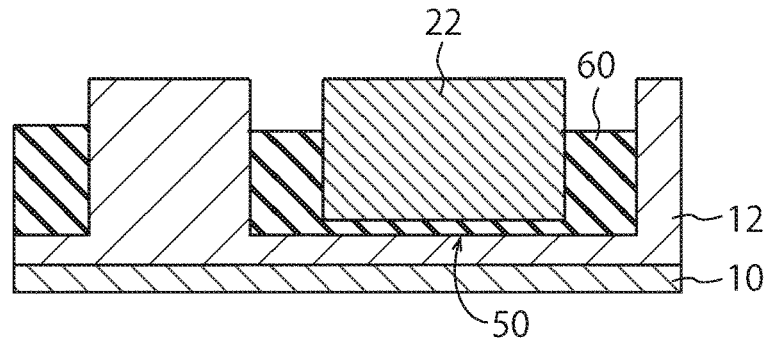
Figure 9A:
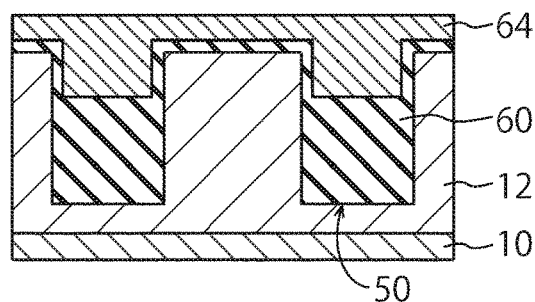
Figure 9B:
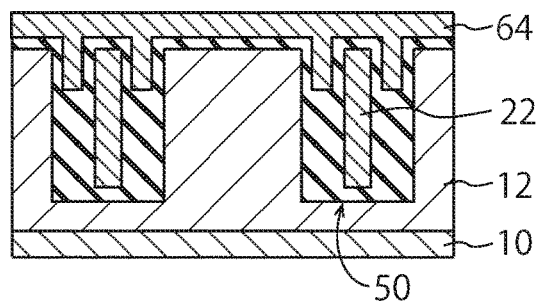
Figure 9C:
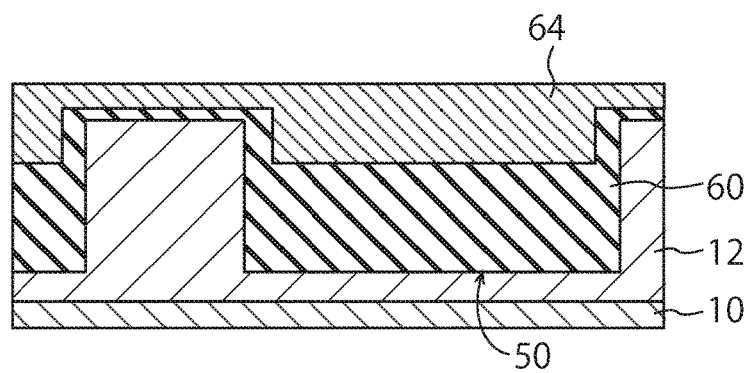
Figure 9D:
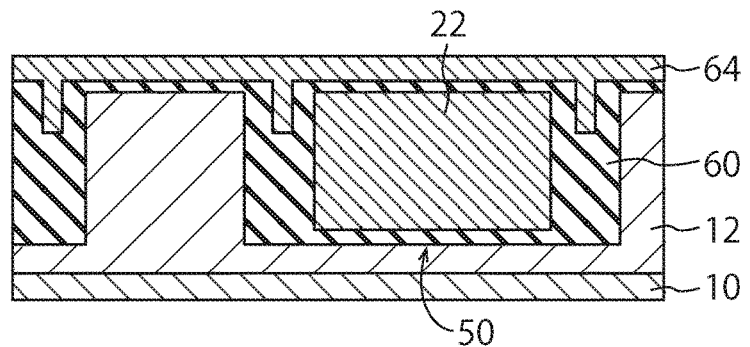
Figure 10A:
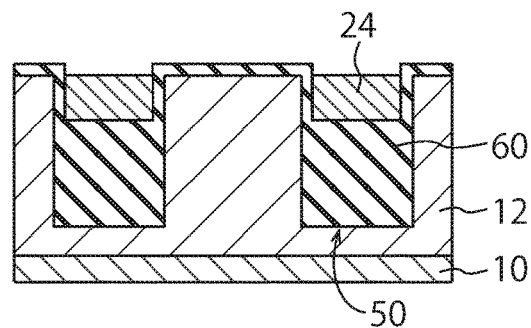
Figure 10B:
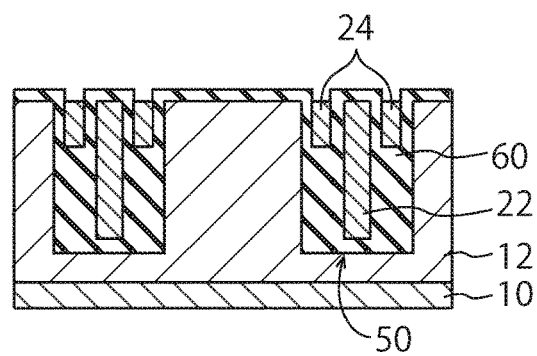
Figure 10C:
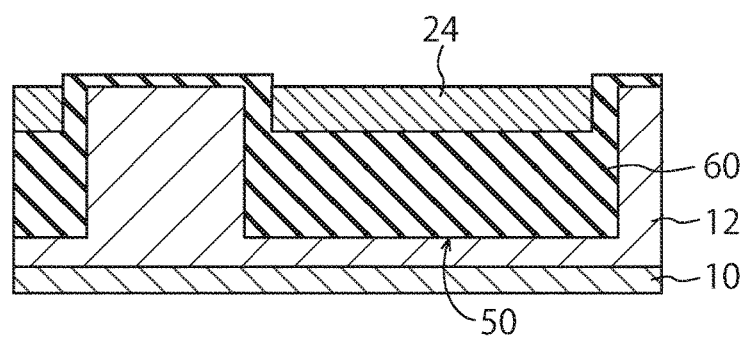
Figure 10D:
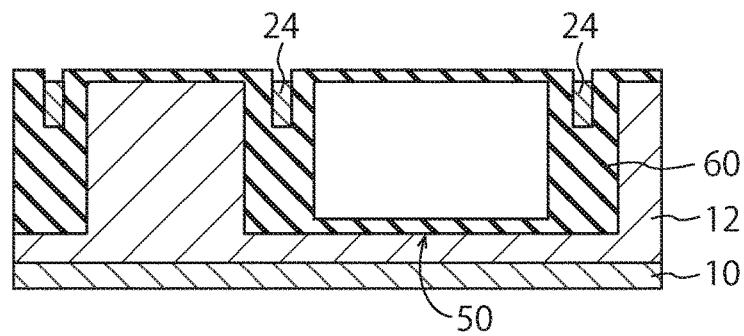
Figure 11A:
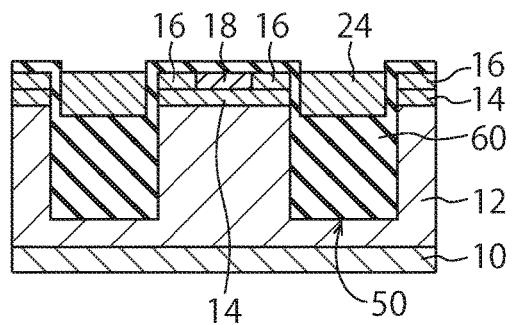
Figure 11B:
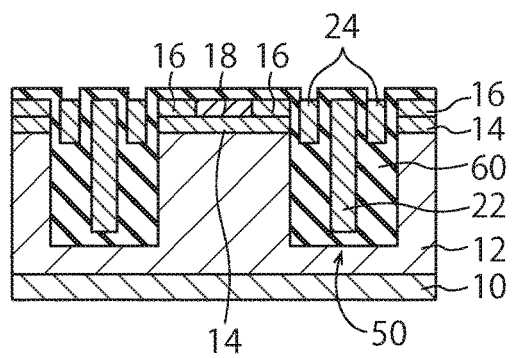
Figure 11C:
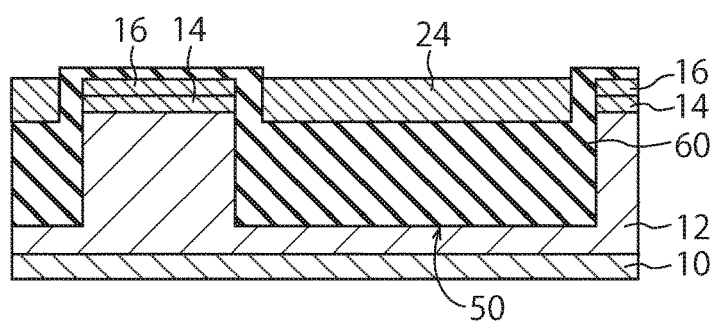
Figure 11D:
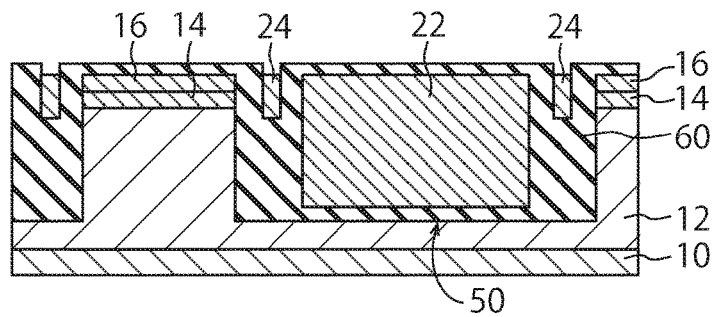

Next, as illustrated in FIGS. 8A to 8D, the insulating film 60 is etched to form a space for the gate region 24. This etching is performed, for example, by selectively etching the insulating film 60 by wet etching. By etching the insulating film 60, the field plate electrode 22 protrudes from the insulating film 60, as illustrated in FIGS. 8B and 8D.

Next, as illustrated in FIGS. 9A to 9D, the insulating film is formed again by the thermal oxidation method or the like, whereby the region of the insulating film 60 is expanded. The drift layer 12 including the inner wall of each of the trenches 50 and the field plate electrode 22 are covered with the newly formed insulating film, and the drift layer 12 and the field plate electrode 22 are insulated from the gate region 24.

On the insulating film 60, a semiconductor film 64 including polysilicon to be the gate region 24 is formed. The semiconductor film 64 is formed by CVD, for example. Further, impurities such as phosphorus (P) are diffused into the polysilicon forming the semiconductor film 64 by, for example, thermal diffusion or ion implantation.

Next, as illustrated in FIGS. 10A to 10D, the semiconductor film 64 is etched, and etched back, whereby the gate region 24 is formed, via the insulating film 60, between the inner wall of each of the trenches 50 and the field plate electrode 22, inside each of the trenches 50. This etching is performed by, for example, RIE, CDE or CMP.

Next, as illustrated in FIGS. 11A to 11D, each diffusion region is formed. First, the base region 14 is formed by ion implantation, for example. On the upper surface of the drift layer 12, p-type impurities ($B^+$, $BF_2^+$ and the like) whose concentration exceeds a concentration of n-type impurities of the drift layer 12 are implanted to the depth at which the base region 14 is formed.

Subsequently, above the upper surface of the base region 14 formed, n-type impurities ($P^+$, $As^+$ and the like) whose concentration exceeds the concentration of the p-type impurities in the base region 14 are implanted to the depth at which the source region 16 is formed. In this way, the p-type base region 14 and the $n^+$-type source region 16 are formed. Subsequently, selectively above the upper surface of the source region 16 formed, p-type impurities ($B^+$, $BF_2^+$ and the like) whose concentration exceeds the concentration of the n-type impurity in the source region 16 is implanted to the depth at which the base region 14 is reached. As a result, the $p^+$-type base contact region 18 that reaches the base region 14 is formed, selectively inside the source region 16. As illustrated in FIGS. 11A to 11D, the base contact region 18 is formed along the second direction selectively inside the source region 16 between the trenches 50 along the first direction. When the base contact region 18 is formed, implantation may be performed by forming resist in a portion other than a portion to be formed, or ion implantation may be performed selectively in a region where the base contact region 18 is formed without forming the resist.

Next, as illustrated in FIGS. 12A to 12D, the insulating film 20 and a contact region to each region are formed. First, an insulating film is newly deposited on the insulating film 60 by CVD, thermal oxidation method, or the like, and the insulating film 20 is formed.

Subsequently, a hole is formed in the insulating film 20 for forming a contact to each region to which a voltage is applied. This hole is formed, for example, by selectively forming a mask on the insulating film 20, and selectively etching the insulating film 20. The mask is formed by photolithography, for example. The etching is performed by, for example, dry etching such as RIE. Then, the mask is removed, whereby holes 66, 68, and 70 for forming contacts are formed, as illustrated in FIGS. 12A to 12D.

Figure 12A:
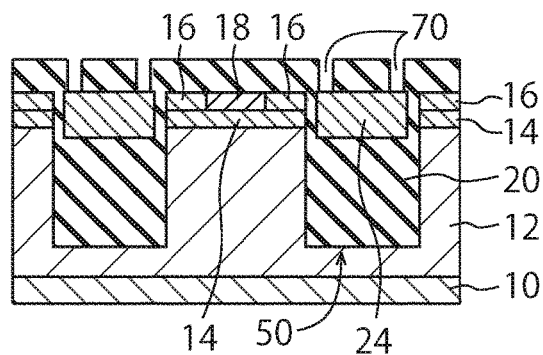
Figure 12B:
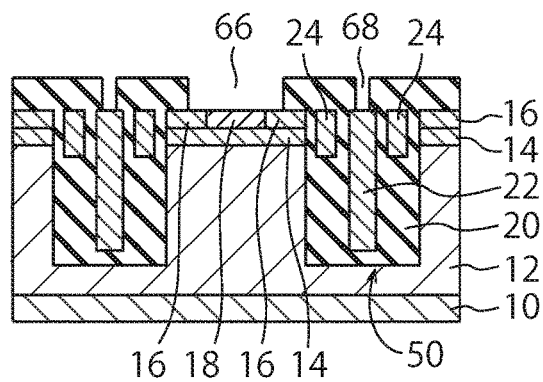
Figure 12C:
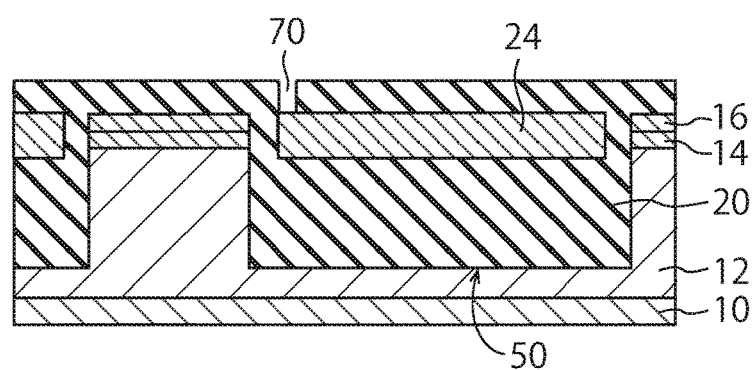
Figure 12D:
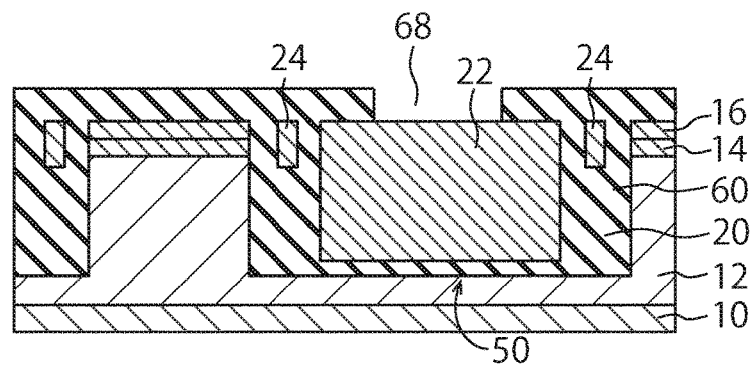

As illustrated in FIG. 12B, the hole 66 is formed in the insulating film 20, such that the upper surface of the base contact region 18 and a part of the upper surface of the source region 16 adjacent thereto are exposed. As illustrated in FIGS. 12B and 12D, the hole 68 is formed in the insulating film 20, such that a part of the field plate electrode 22 is exposed. As illustrated in FIGS. 12A and 12C, the hole 70 is formed in the insulating film 20, such that a part of the gate region 24 is exposed.

Next, as illustrated in FIGS. 13A to 13D, after forming each hole for contact, the first metal layer 30 and the second metal layer 34 are formed. First, thin films of titanium (Ti) and titanium nitride (TiN) are formed by sputtering on the lower surfaces of the holes 66, 68, and 70, that is, the upper surfaces of various semiconductor layers. For example, after forming the titanium thin film by sputtering, the titanium nitride thin film is formed by sputtering to cover the titanium thin film formed. After that, these titanium/titanium nitride films are subjected to a silicide reaction at an appropriate timing to form titanium silicide (TiSi) on the surfaces of various semiconductor films, and barrier metal is formed of titanium nitride. This silicide is formed, whereby low resistance is achieved between the metal (contact metal) and the field plate electrode 22, the base contact region 18, the source region 16 and the gate region 24. This silicide may be formed of, for example, salicide.

Subsequently, metal to be each contact is formed. The metal forming the contact is, for example, tungsten (W). This metal is formed by CVD, for example. Then, this metal is etched back by, for example, dry etching to form various contacts. In this way, the first source contact 26, the second source contact 28, and the gate contact 32 are formed in the holes 66, 68, and 70, respectively.

Subsequently, metal to be the first metal layer 30 and the second metal layer 34 is formed. This metal is, for example, aluminum (Al) or copper (Cu), and is formed by sputtering.

Figure 13A:
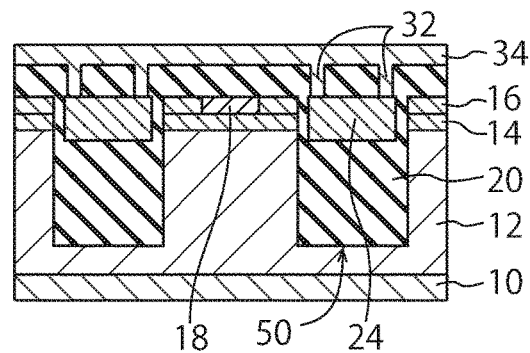
Figure 13B:
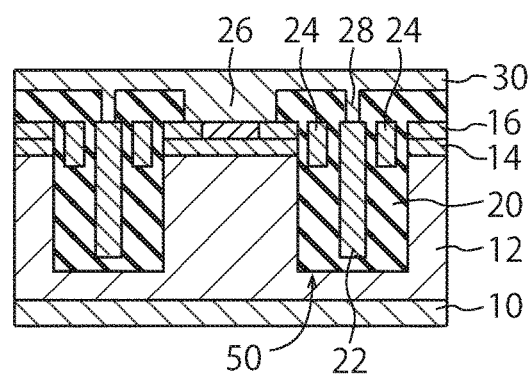
Figure 13C:
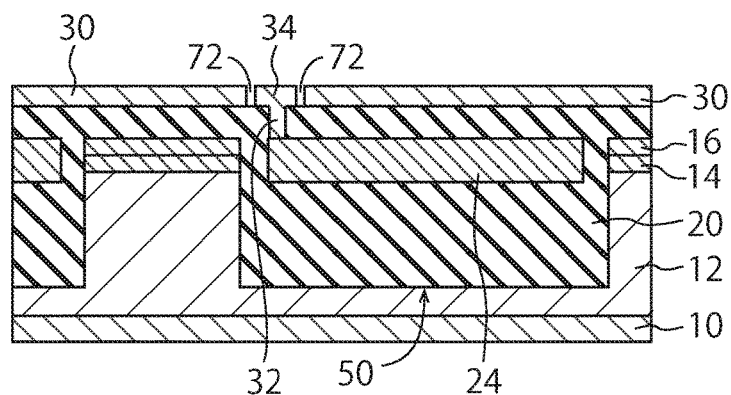
Figure 13D:
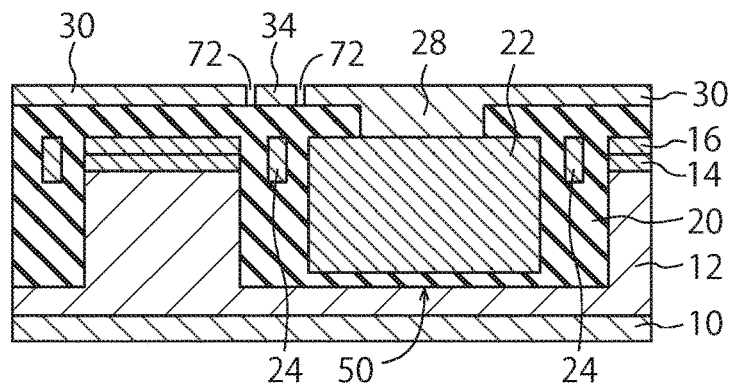
Figure 14A:
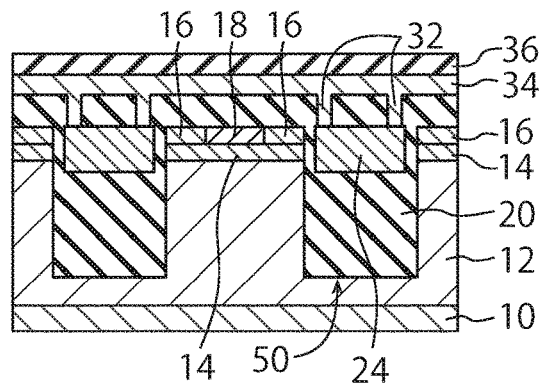
Figure 14B:
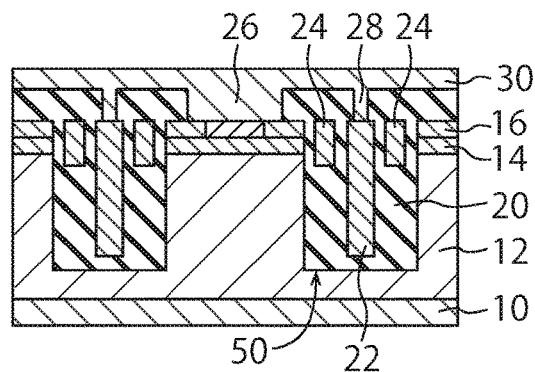
Figure 14C:
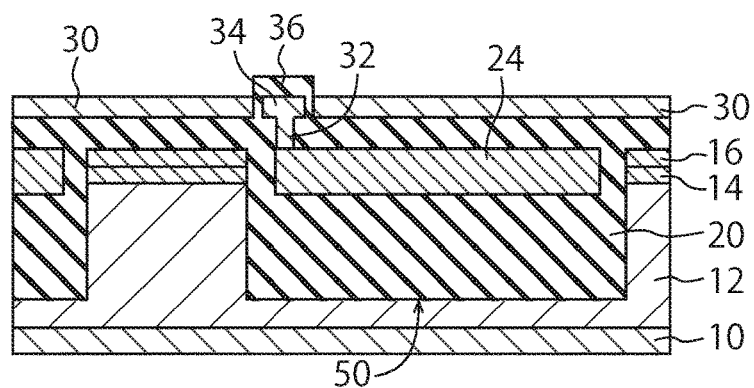
Figure 14D:
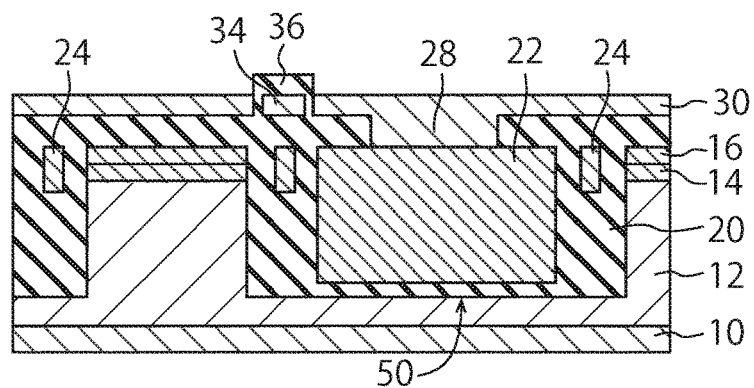

Subsequently, as illustrated in FIGS. 13C and 13D, a space 72 for forming an insulating film is formed by selectively removing the above metal, to separate the first metal layer 30 from the second metal layer 34. A mask is selectively formed in a region to be the first metal layer 30 and a region to be the second metal layer 34, and the metal is etched, whereby the formation is performed. The mask is formed by photolithography, for example. After forming the mask, the metal is etched by RIE, for example. Then, the space 72 is formed by removing the mask.

The above metal forming and etching processes may be reversed. That is, it is also possible to perform the formation of the space 72 that separates the first metal layer 30 and the second metal layer 34 as illustrated in FIGS. 13A to 13D, by forming the mask for the region to form the interlayer insulating film 36, then forming the metal, and thereafter removing the mask.

Next, as illustrated in FIGS. 14A to 14D, the interlayer insulating film 36 is selectively formed on the upper surface of the second metal layer 34. First, an insulating film is formed on the upper surfaces of the first metal layer 30 and the second metal layer 34 by CVD, for example. Next, the insulating film formed on the first metal layer 30 is selectively removed such that the interlayer insulating film 36 remains on the upper surface of the second metal layer 34. For example, a mask is formed by photolithography on the second metal layer 34 and on the surface of its peripheral region on the interlayer insulating film 36, and then the insulating film formed on the first metal layer 30 is etched by RIE or the like. In this way, the interlayer insulating film 36 is selectively formed on the upper surface of the second metal layer 34 and its peripheral region, and between the first metal layer 30 and the second metal layer 34.

Finally, as illustrated in FIGS. 2A, 2B, 3A and 3B, the third metal layer 38 is formed, and then the semiconductor device 1 is formed. First, a metal to be the third metal layer 38 is formed on the upper surfaces of the interlayer insulating film 36 and the second metal layer 34 by sputtering, for example. Thereafter, planarization is performed by CMP, for example. Subsequently, unnecessary metal for the subsequent process may be masked by photolithography and removed by RIE or wet etching. The unnecessary metal means, for example, a metal existing around a chip or the like that is preferably removed at the time of dicing in a post-process subsequent to the preceding process.

(Trench Arrangement Example)

Hereinafter, a modification of the arrangement of the trenches 50 and the like will be described.

Figure 15:
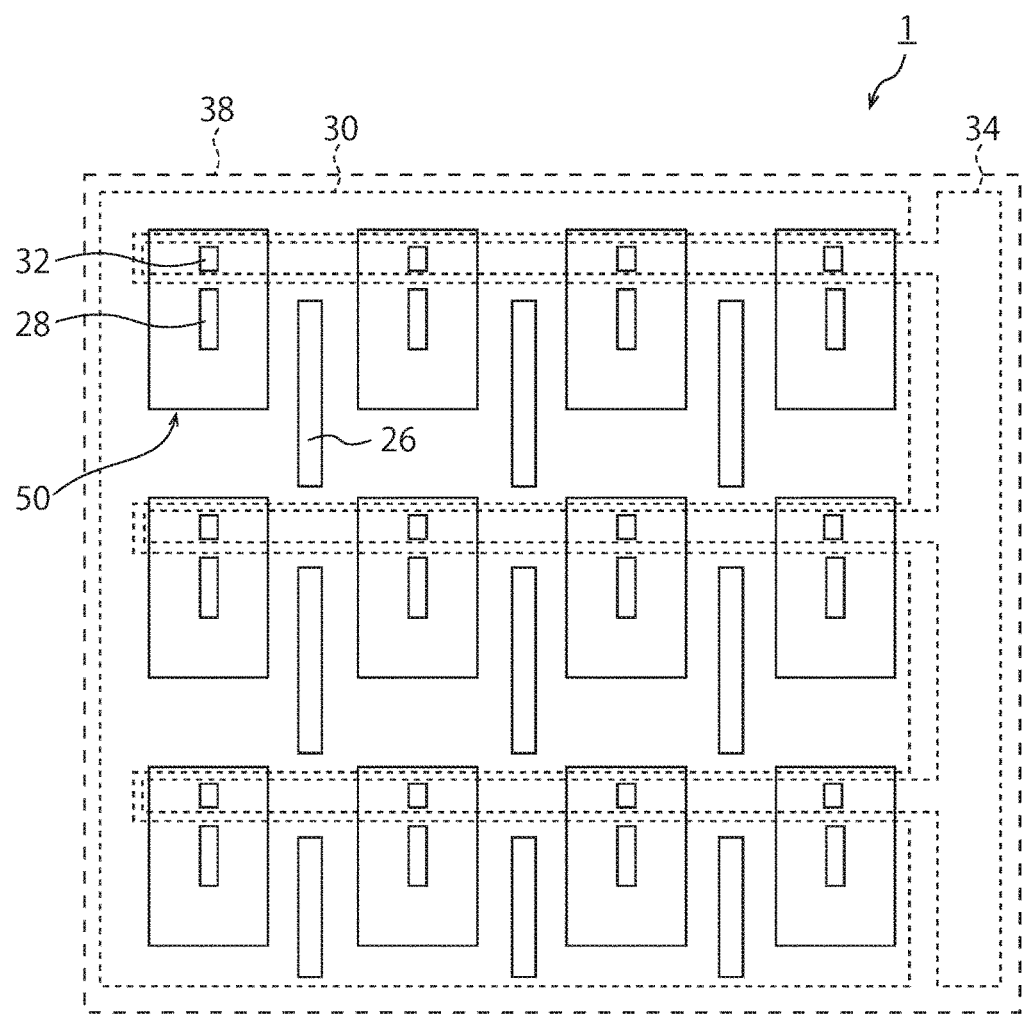
FIGS. 15 to 18C are plan views schematically illustrating other examples of the semiconductor device according to the embodiment.

FIG. 15 illustrates an example in which one gate contact 32 is formed connecting the gate region 24 in each of the trenches 50 and the second metal layer 34. In this way, there is no need for multiple gate contacts 32, and the one gate contact 32 may be used. In addition, the example is illustrated in which the gate contact 32 and the second source contact 28 are on the same straight line along the second direction; however, the present invention is not limited thereto. For example, the gate contact 32 may be formed at a position deviated from the second source contact 28 not to be on the same straight line in the second direction In FIG. 16, the arrangement of the trenches 50 is not a rectangular lattice but a rhombic lattice. With this configuration, it is possible to secure a region of the drift layer 12 similar to the case in the rectangular lattice described above. Further, the arrangement of the semiconductor layers including the drift layer 12, the base region 14, and the source region 16 is smoothed compared to the arrangement of FIG. 1. This is because, in the arrangement of FIG. 1, there are four portions where the semiconductor layers cross each other around each of the trenches 50, but in this modification, such a crossed portion does not exist. With such an arrangement, as a whole of the semiconductor device 1, the channel and the depletion layer can be more uniformly formed, and there is a possibility that the effect of reducing the resistance can be obtained more.

Figure 16:
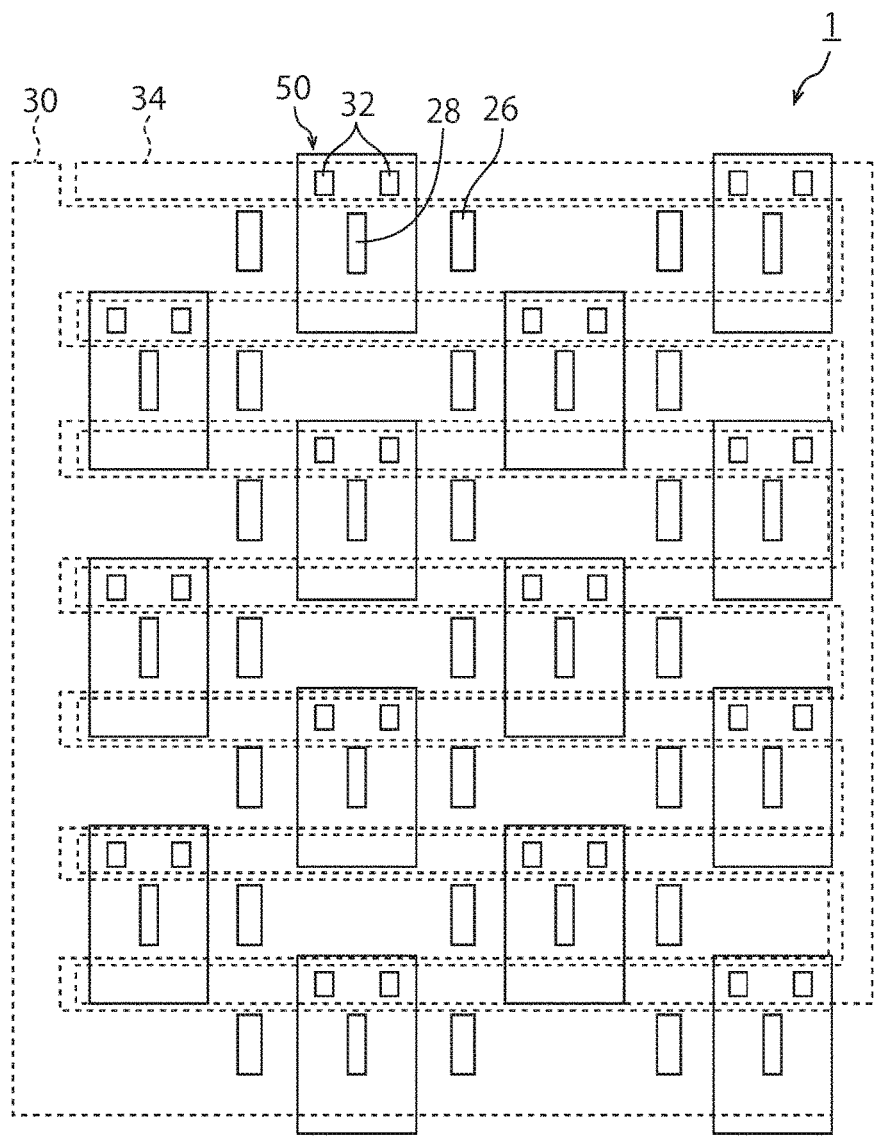
Figure 17:
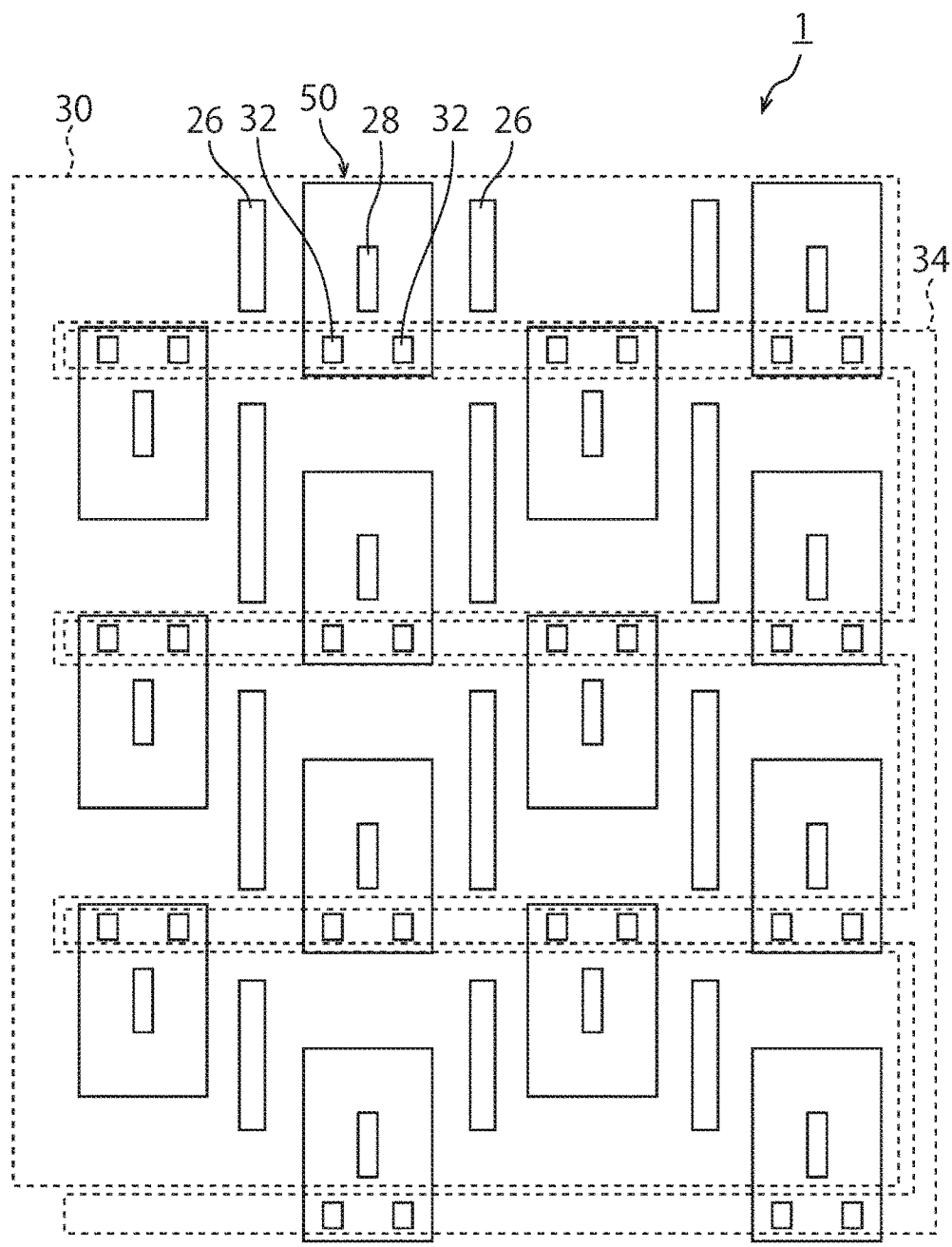

In FIG. 17, the arrangement of the trenches 50 is equivalent to that in FIG. 16, and in the trenches 50 adjacent in the second direction, the gate contacts 32 are arranged to line up on a straight line. With this configuration, it is possible to obtain the same effect as in FIG. 16, and to simplify the shapes of the first metal layer 30 and the second metal layer 34.

Figure 18A:
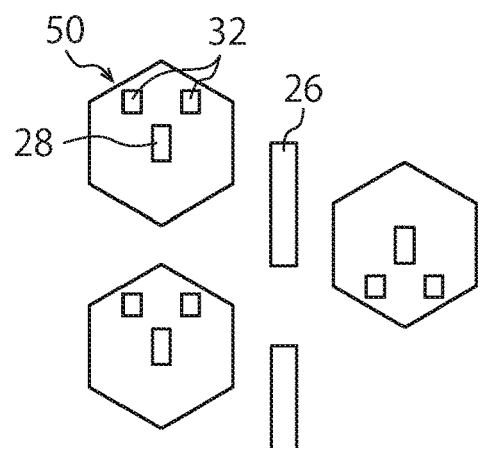
Figure 18B:
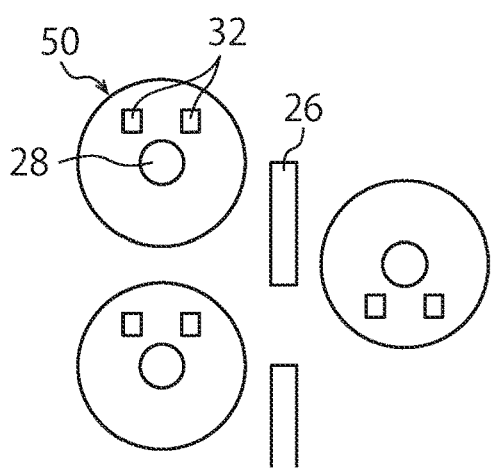
Figure 18C:
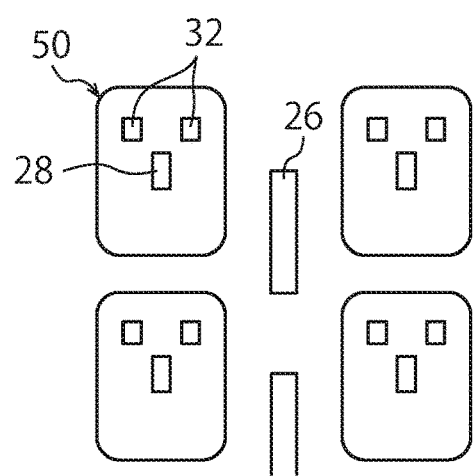

FIGS. 18A to 18C are views illustrating other examples of the arrangement of the trenches 50 and the shapes of the trenches 50. As illustrated in FIG. 18A, the shape of each of the trenches 50 may be a hexagonal shape. With this shape, for example, as illustrated in the figure, when the trenches are arranged in a rhombic lattice, the area where the drift layer 12 and the like exist depending on the region can be made more uniform. As illustrated in FIG. 18A, hexagons having the same orientation may be arranged in all columns, or alternatively, the orientation of the trenches 50 may be changed by 30° instead.

In FIG. 18B, the shape of each of the trenches 50 is circular. By making the shape circular like this, it is possible to increase the degree of freedom of arrangement. In this case, the field plate electrode 22 may also be formed in a circular shape. Since the field plate electrode 22 is formed in a circular shape, a distance between the field plate electrode 22 and the inner wall in each of the trenches 50 can be kept substantially uniform, so that influence of the field plate electrode 22 applied to the drift layer 12 can be made more even. In addition, the shape is not necessary to be exactly circular, and may be elliptical.

In FIG. 18C, each of the trenches 50 has a chamfered rectangular shape. In this way, the shape need not be exactly rectangular. It is not necessary to accurately form a rectangular shape by a process or the like, and the yield can be further increased. In addition, the chamfered portion makes it possible to equalize a distance between the field plate electrode 22 and the drift layer 12 as compared with the rectangular case, as in the case of the circular shape. The hexagonal shape illustrated in FIG. 18A may be chamfered.

The shapes described above are examples, and the shape of each of the trenches 50 is not limited thereto. As long as each of the trenches 50 is formed independently from the other trenches 50 and the field plate electrode 22, the gate region 24, the source contact, and the like are similarly formed, it does not exceed the embodiment of the present invention.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a drain layer of a first conductivity type extending in a first direction and a second direction crossing the first direction;
   a drift layer of the first conductivity type formed on a surface that is one surface perpendicular to a third direction crossing the first direction and the second direction of the drain layer;
   a base region of a second conductivity type formed on a surface of the drift layer;
   a source region of the first conductivity type formed on a surface of the base region;
   a plurality of trenches formed in an array in the first direction and the second direction, the plurality of trenches each reaching the drift layer through the base region along the third direction from a surface of the source region;
   a base contact region of the second conductivity type formed along the second direction in a region in which the plurality of trenches do not contiguously exist along the second direction between the plurality of trenches along the first direction, the base contact region being formed in the source region to electrically connect the source region to the base region being separate from the plurality of trenches;
   a plurality of gate regions each formed along an inner wall of corresponding one of the plurality of trenches, via an insulating film, inside the corresponding one of the plurality of trenches;
   a plurality of field plate electrodes each formed in an adjacent from corresponding one of the gate regions, via the insulating film, inside the corresponding one of the plurality of trenches along the third direction, and formed longer than the corresponding one of the gate regions in the third direction;
   a plurality of first source contacts each formed on the base contact region and the source region along the second direction between the plurality of trenches along the first direction, the first source contacts electrically connect the base contact region to the source region;
   a plurality of second source contacts on each of the field plate electrode connected the corresponding one of the field plate electrodes;

a plurality of gate contacts on the corresponding one of the gate regions, electrically connected the corresponding gate region;

a first metal layer being connected to the base contact region and the source region via a first source contact, and being connected to corresponding one of the field plate electrodes via a second source contact;

a second metal layer being insulated via the insulating film from the first metal layer, and being connected to corresponding one of the gate regions via a gate contact; and a third metal layer formed to be layered in the third direction of the first metal layer and the second metal layer, to be connected to the first metal layer and to be insulated from the second metal layer via the insulating film.

2. The semiconductor device according to claim 1, wherein the plurality of trenches are arranged in a rectangular lattice or a rhombic lattice.

3. The semiconductor device according to claim 2, wherein the first direction and the second direction, and the third direction are substantially orthogonal to each other.

4. The semiconductor device according to claim 2, wherein
the first direction and the second direction are substantially orthogonal to each other,
the plurality of trenches each are a rectangular trench that has sides in the first direction and the second direction and in which the sides extending in the second direction are longer than the sides extending in the first direction, and
the field plate electrodes are formed along the second direction, in the respective plurality of trenches.

5. The semiconductor device according to claim 2, wherein each of the plurality of trenches has a hexagonal shape, a circular shape, an elliptical shape, or a chamfered rectangular or hexagonal shape.

6. The semiconductor device according to claim 1, wherein the first direction and the second direction, and the third direction are substantially orthogonal to each other.

7. The semiconductor device according to claim 6, wherein
the first direction and the second direction are substantially orthogonal to each other,
the plurality of trenches each are a rectangular trench that has sides in the first direction and the second direction and in which the sides extending in the second direction are longer than the sides extending in the first direction, and
the field plate electrodes are formed along the second direction, in the respective plurality of trenches.

8. The semiconductor device according to claim 6, wherein each of the plurality of trenches has a hexagonal shape, a circular shape, an elliptical shape, or a chamfered rectangular or hexagonal shape.

9. The semiconductor device according to claim 1, wherein
the first direction and the second direction are substantially orthogonal to each other,
the plurality of trenches each are a rectangular trench that has sides in the first direction and the second direction and in which the sides extending in the second direction are longer than the sides extending in the first direction, and
the field plate electrodes are formed along the second direction, in the respective plurality of trenches.

10. The semiconductor device according to claim 1, wherein each of the plurality of trenches has a hexagonal shape, a circular shape, an elliptical shape, or a chamfered rectangular or hexagonal shape.

* * * * *